(12) United States Patent
Bae et al.

(10) Patent No.: US 7,973,885 B2
(45) Date of Patent: Jul. 5, 2011

(54) DISPLAY APPARATUS HAVING A COLOR LAYER INTERPOSED BETWEEN SUBSTRATES AND HAVING A PLURALITY OF MICROCAPSULES FORMED BY ENCAPSULATING POLARITY PARTICLES

(75) Inventors: Ju-Han Bae, Suwon-si (KR); Hyung-Il Jeon, Incheon (KR)

(73) Assignee: Samsung Electronics Co., Ltd. (KR)

( * ) Notice: Subject to any disclaimer, the term of this patent is extended or adjusted under 35 U.S.C. 154(b) by 913 days.

(21) Appl. No.: 11/869,240

(22) Filed: Oct. 9, 2007

(65) Prior Publication Data

US 2008/0084364 A1 Apr. 10, 2008

(30) Foreign Application Priority Data

Oct. 9, 2006 (KR) .................. 10-2006-0098064

(51) Int. Cl.
*G02F 1/1333* (2006.01)
*G02F 1/1335* (2006.01)

(52) U.S. Cl. .............. 349/106; 349/84; 257/59; 257/72; 345/92

(58) Field of Classification Search .................. 349/106, 349/42–47; 257/59, 72; 345/92
See application file for complete search history.

(56) References Cited

U.S. PATENT DOCUMENTS

| | | | | |
|---|---|---|---|---|
| 5,691,782 | A * | 11/1997 | Nishikawa et al. | 349/47 |
| 5,875,009 | A * | 2/1999 | Shibahara | 349/43 |
| 6,130,729 | A * | 10/2000 | Oh et al. | 349/43 |
| 6,486,866 | B1* | 11/2002 | Kuwahara et al. | 345/107 |
| 2004/0125261 | A1* | 7/2004 | Lee et al. | 349/43 |
| 2005/0140834 | A1* | 6/2005 | Imai | 349/24 |
| 2006/0017659 | A1* | 1/2006 | Ogawa et al. | 345/30 |

FOREIGN PATENT DOCUMENTS

| | | |
|---|---|---|
| KR | 1020040091480 | 10/2004 |
| KR | 1020060039664 | 5/2006 |
| KR | 1020060074736 | 7/2006 |

* cited by examiner

*Primary Examiner* — Julie-Huyen L Ngo
(74) *Attorney, Agent, or Firm* — Innovation Counsel LLP

(57) ABSTRACT

Disclosed is a display substrate including a pixel electrode and a thin film transistor formed thereon. The thin film transistor includes a gate electrode, a source electrode, and a drain electrode, and the pixel electrode is formed by extending the drain electrode thereby reducing the required number of process steps and photo masks.

6 Claims, 20 Drawing Sheets

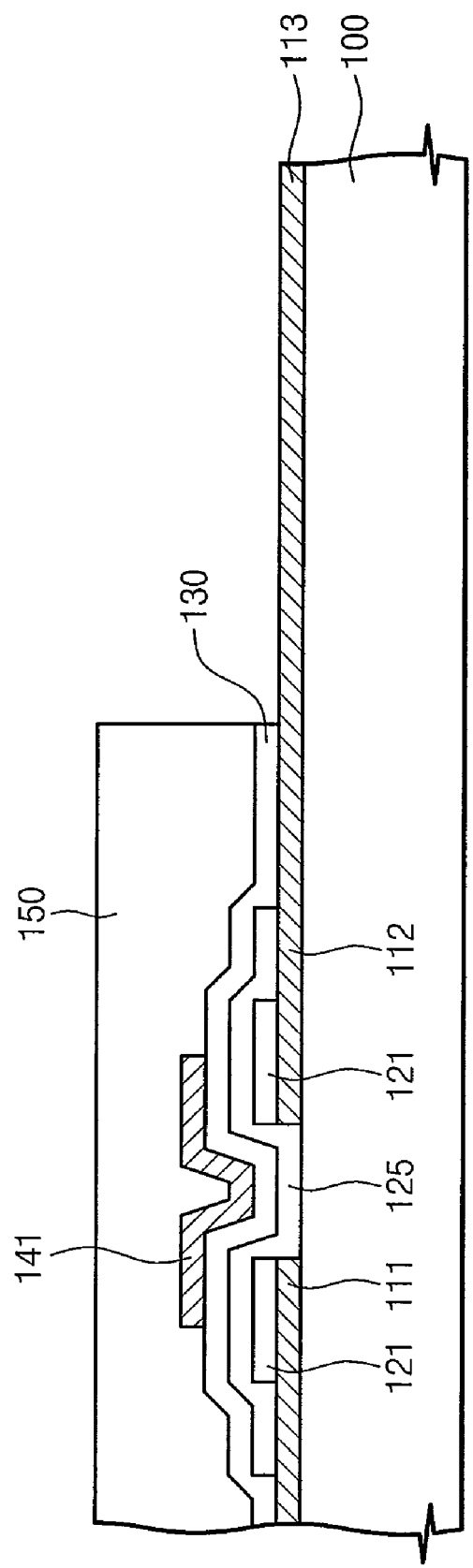

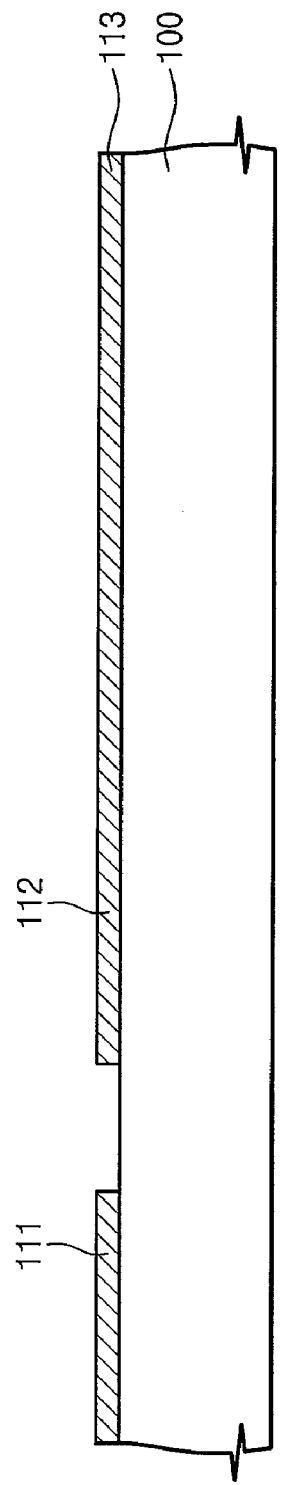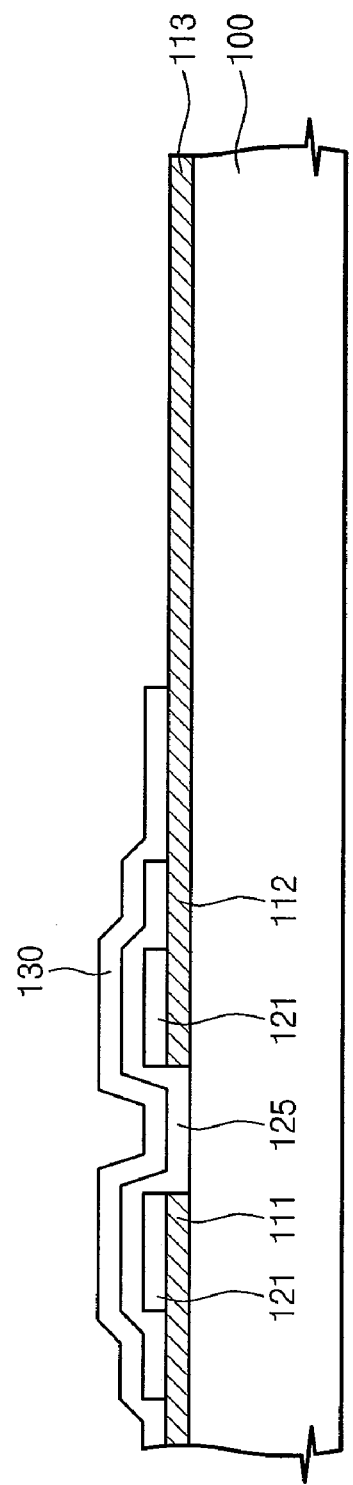

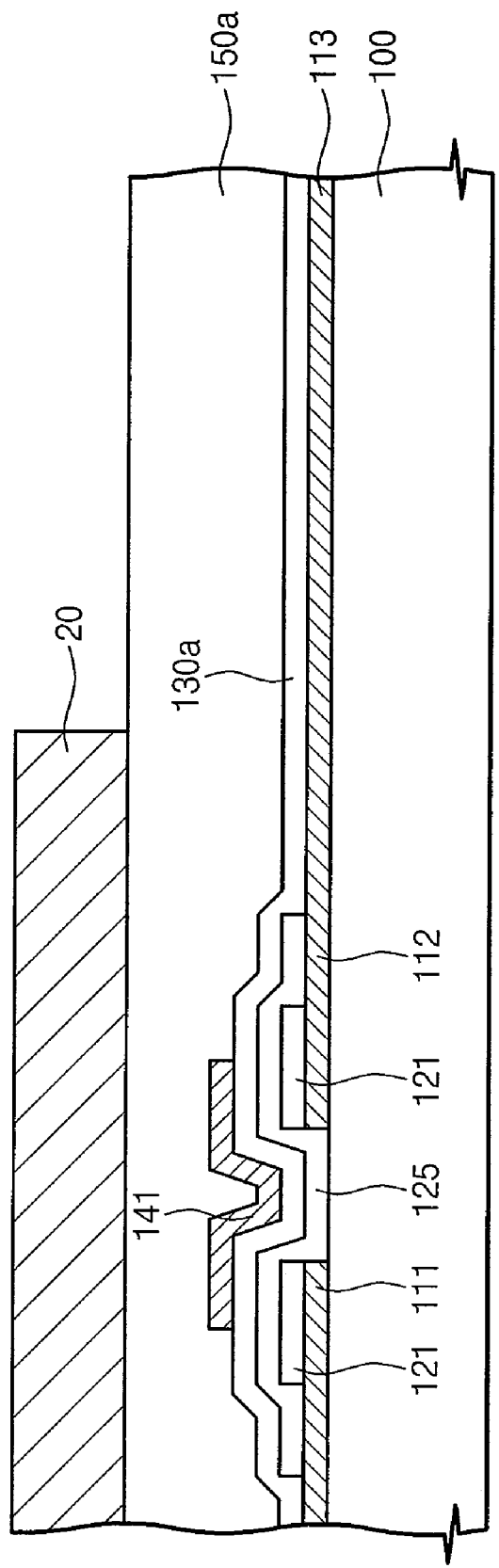

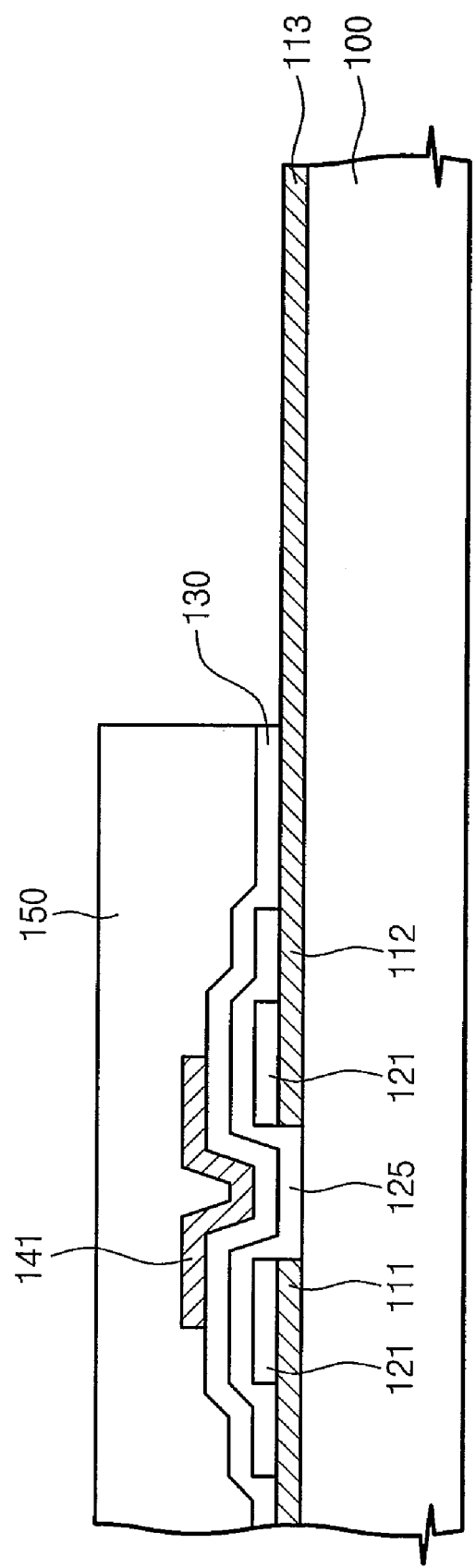

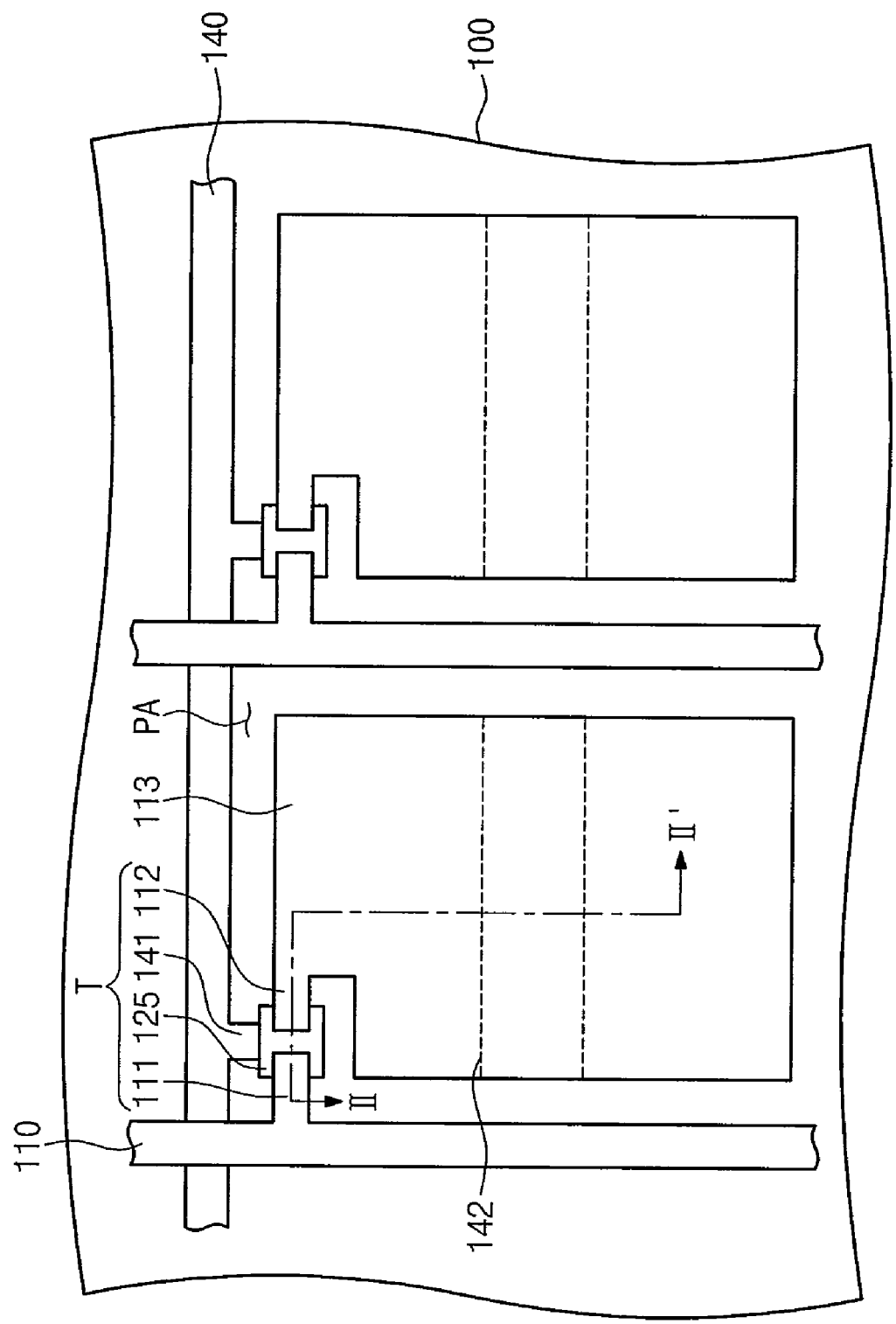

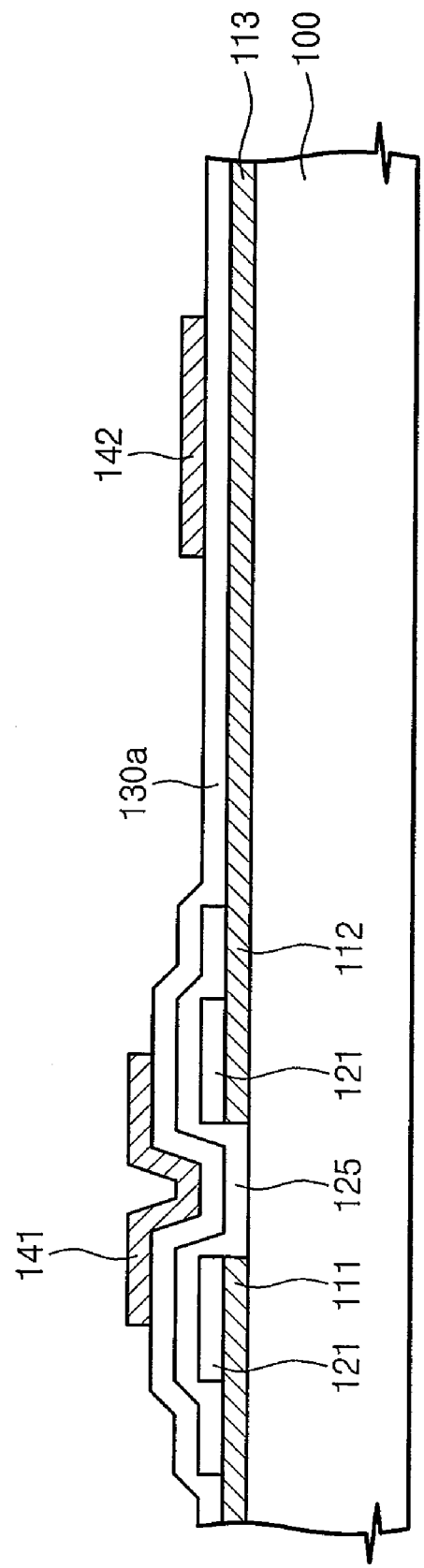

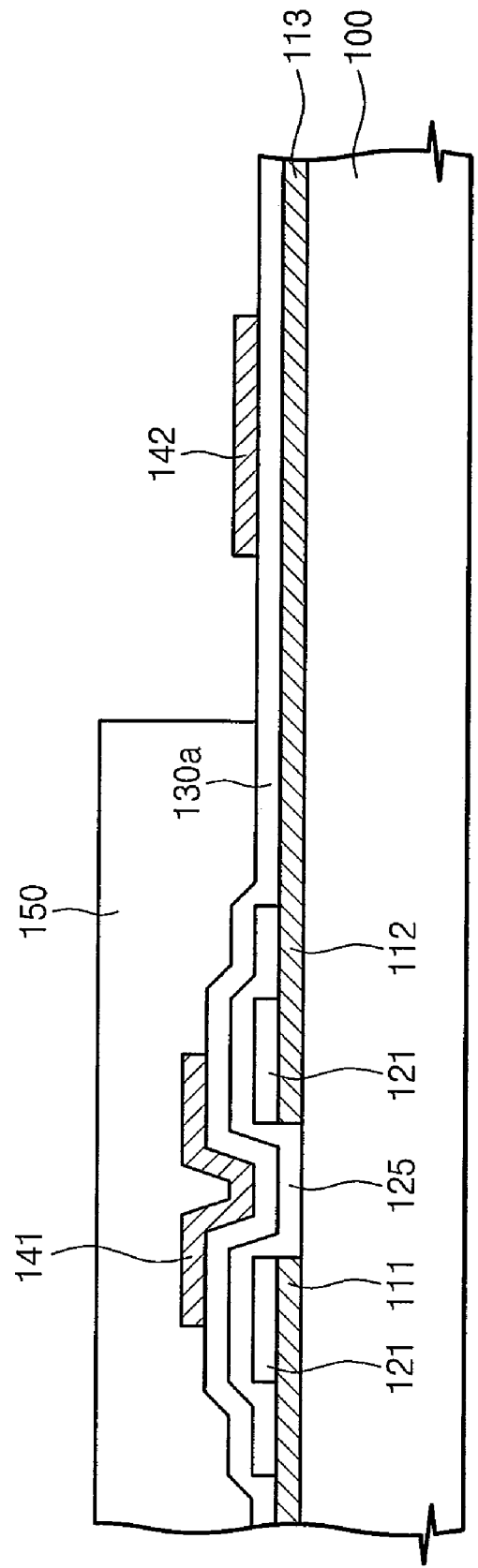

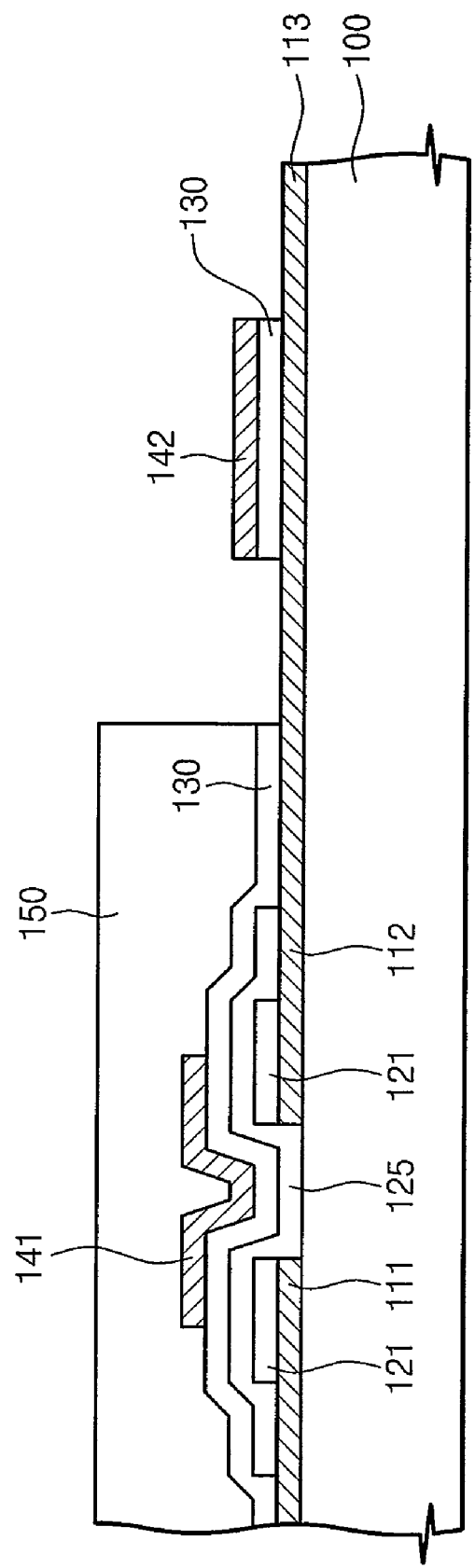

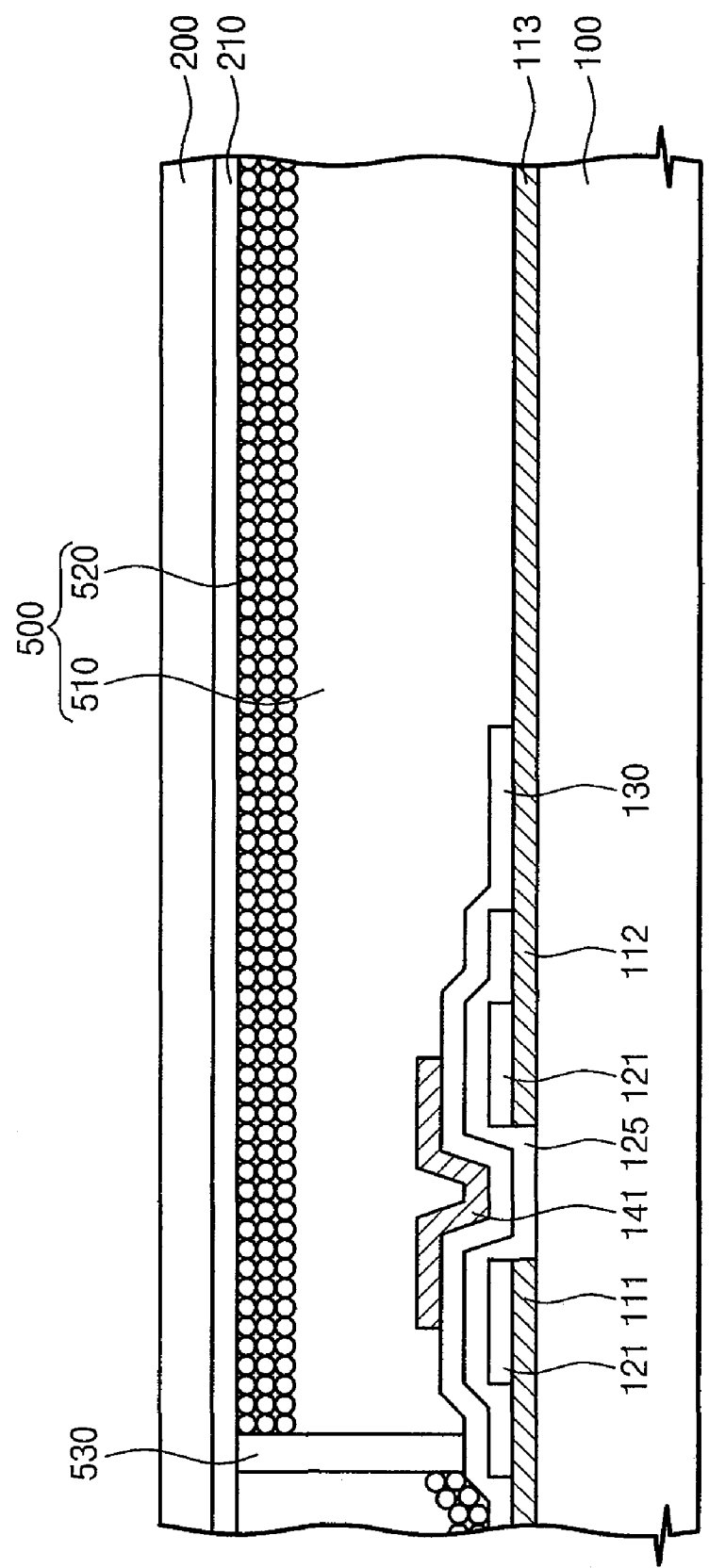

US 7,973,885 B2

DISPLAY APPARATUS HAVING A COLOR LAYER INTERPOSED BETWEEN SUBSTRATES AND HAVING A PLURALITY OF MICROCAPSULES FORMED BY ENCAPSULATING POLARITY PARTICLES

CROSS-REFERENCE TO RELATED APPLICATION

This application relies for priority upon Korean Patent Application No. 2006-98064 filed on Oct. 9, 2006, the contents of which are herein incorporated by reference in its entirety.

BACKGROUND OF THE INVENTION

1. Field of the Invention

The present invention relates to a display apparatus and, more particularly to a display apparatus having an improved substrate and a method of fabricating the same.

2. Description of the Related Art

In general, display apparatus receive an electrical signal to display an image. The display apparatuses include a liquid crystal display (LCD), an organic electro-luminescent display (OELD), and an electro-phoretic display (EPD).

The display apparatus includes a substrate. A plurality of pixel areas, are defined on the substrate. The pixel areas are provided with thin film transistors and pixel electrodes. The thin film transistors and the pixel electrodes are formed by depositing conductive layers on the substrate and then patterning the resultant structure.

The substrate is provided with a plurality of insulating layers formed above and below the thin film transistor and the pixel electrode. Some insulating layers are patterned. Accordingly, when manufacturing a substrate for the display apparatus, a plurality of patterning processes are performed with respect to the conductive layers and the insulating layers. When carrying out the patterning process, a photolithographic process including exposure and development is performed. Generally, the photolithographic process is individually performed with respect to target layers to be patterned. As the number of the target layers increases, the manufacturing procedure and the manufacturing costs increase.

SUMMARY OF THE INVENTION

The present invention o provides an improved method of fabricating the display substrate for a display apparatus In one aspect of the present invention, a display substrate comprises a data line, a gate line, a source electrode, a drain electrode, a pixel electrode, a semiconductor layer pattern, a first insulating layer pattern, and a gate electrode. The data line and the gate line cross each other while being insulated from each other on a substrate having a pixel area defined thereon. The source electrode branches from the data line. The drain electrode is spaced apart from the source electrode. The pixel electrode expands into the pixel area from an end portion of the drain electrode. The semiconductor layer pattern covers the source electrode and the drain electrode. The first insulating layer pattern covers the semiconductor layer pattern, and is opened at an area where the pixel electrode is formed. The gate electrode branches from the gate line on the first insulating layer pattern while partially overlapping with the source electrode and the drain electrode, when viewed in a plan view.

In another aspect of the present invention, a method of fabricating a display substrate is performed as follows.

A data line on the display substrate having a pixel area defined thereon, a source electrode branching from the data line, a drain electrode spaced apart from the source electrode, and a pixel electrode expanding into the pixel area from an end portion of the drain electrode are formed. A semiconductor layer pattern is formed to cover the source electrode and the drain electrode. A first insulating layer pattern is formed to cover the semiconductor layer pattern except for the area in which the pixel electrode is formed. A gate line and a gate electrode are formed on the first insulating layer pattern such that the gate line crosses the data line corresponding to the pixel area and the gate electrode branches from the gate line while partially overlapping the source electrode and the drain electrode, when viewed in a plan view.

In one aspect of the present invention, a display apparatus comprises a first substrate, a second substrate, a data line, a gate line, a source electrode, a drain electrode, a pixel electrode, a semiconductor layer pattern, a first insulating layer pattern, a gate electrode, and a common electrode. A pixel area is defined on the first substrate. The second substrate faces the first substrate. The data line and the gate line cross each other while being insulated from each other on the first substrate thereby defining a pixel area. The source electrode branches from the data line. The drain electrode is spaced apart from the source electrode. The pixel electrode expands into the pixel area from an end portion of the drain electrode. The semiconductor layer pattern covers the source electrode and the drain electrode. The first insulating layer pattern covers the semiconductor layer pattern except for an area in which the pixel electrode is formed. The gate electrode branches from the gate line on the first insulating layer pattern while partially overlapping the source electrode and the drain electrode, when viewed in a plan view. The common electrode is formed on the second substrate.

As described above, in the display substrate, the method of fabricating the same, and the display apparatus having the same, the drain electrode and the pixel electrode are simultaneously formed through the same process. Accordingly, the number of process steps and photo masks is reduced, the productivity is improved, and the manufacturing costs are reduced.

BRIEF DESCRIPTION OF THE DRAWINGS

The above and other advantages of the present invention will become readily apparent by reference to the following detailed description when considered in conjunction with the accompanying drawings, in which:

FIG. 2B is a sectional view taken along line I-I' shown in FIG. 1 according to another embodiment of the present invention;

FIGS. 3A to 3C are sectional views showing a method of fabricating the display substrate shown in FIG. 2A;

FIGS. 4A to 4F are sectional views showing a method of fabricating the display substrate shown in FIG. 2B;

FIG. 5 is a plan view showing a display substrate according to another embodiment of the present invention;

FIGS. 7A to 7C are sectional views showing a method of fabricating a display substrate shown in FIG. 6;

FIG. 9C is a sectional view taken along line III-III' shown in FIG. 8 according to another embodiment of the present invention.

DESCRIPTION OF THE EMBODIMENTS

Figure 1:
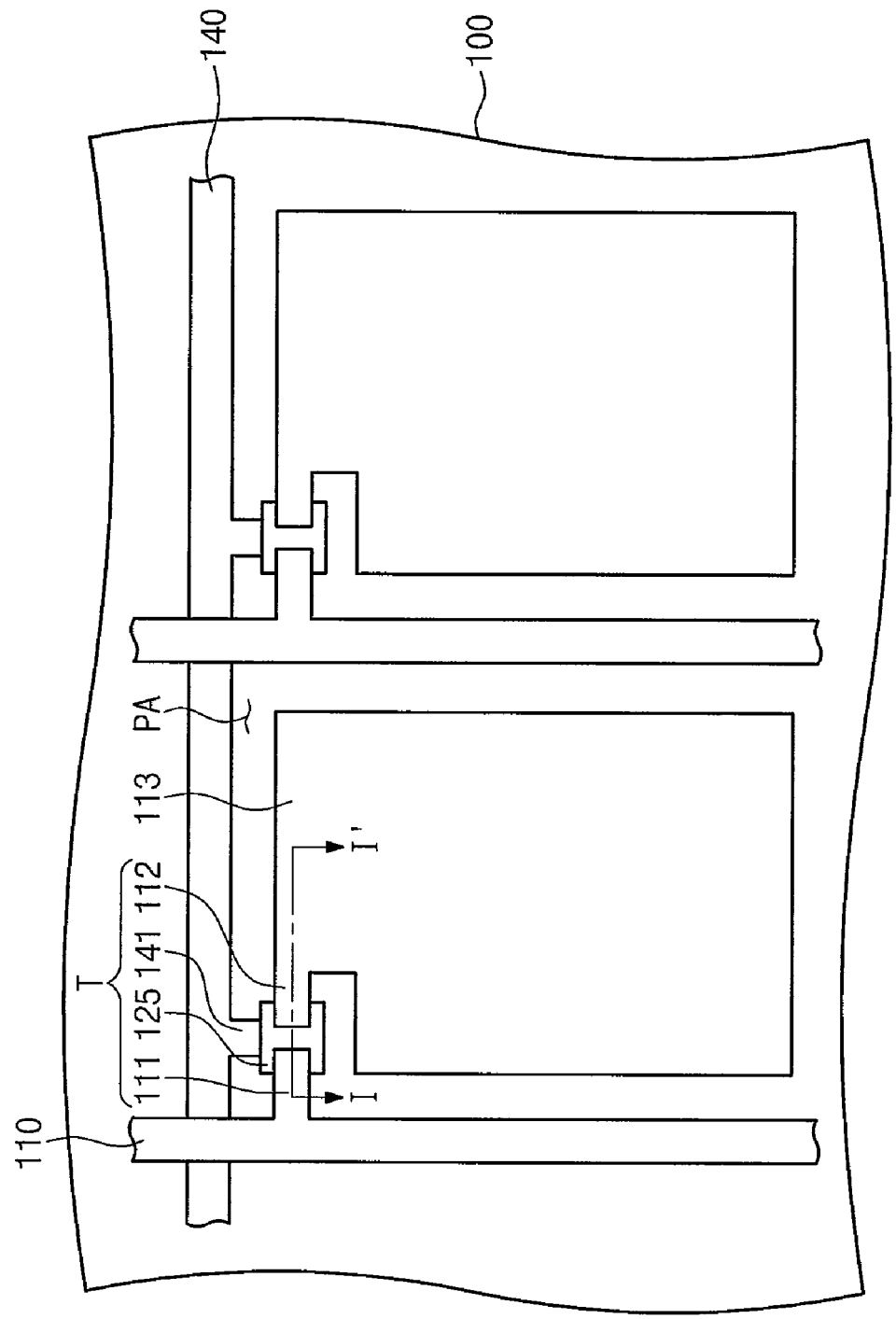
FIG. 1 is a plan view showing a display substrate according to an exemplary embodiment of the present invention.

Hereinafter, embodiments the present invention will be explained in detail with reference to the accompanying drawings. FIG. 1 is a plan view showing a display substrate according to an exemplary embodiment of the present invention.

Referring to FIG. 1, pixel areas, which are for displaying an image, are defined on a substrate 100. The pixel areas are repeatedly formed with the same structure. In the present embodiment or other embodiments, the structure of one pixel area PA will be representatively described, and the same structure is employed for other pixel areas.

A data line 110 and a gate line 140 are formed on the substrate 100, data line 110 extending in a column direction and gate line 140 extending in a row direction. Data line 110 and gate line 140 cross each other defining the pixel area PA where the data and gate lines cross each other.

The pixel area PA includes a thin film transistor T and a pixel electrode 113. The thin film transistor T includes a source electrode 111, a drain electrode 112, a semiconductor layer pattern 125, and a gate electrode 141. The source electrode 111 branches from the data line 110. The drain electrode 112 is spaced apart from the source electrode 111. The semiconductor layer pattern 125 is formed in the space between the source electrode 111 and the drain electrode 112 defining a channel area forming a channel of the thin film transistor T. The gate electrode 141 branches from the gate line 140. The pixel electrode 113 expands into the pixel area PA from the end portion of the drain electrode 112.

Hereinafter, details will be described regarding the vertical structure of the display substrate viewed in the plan view.

Figure 2A:
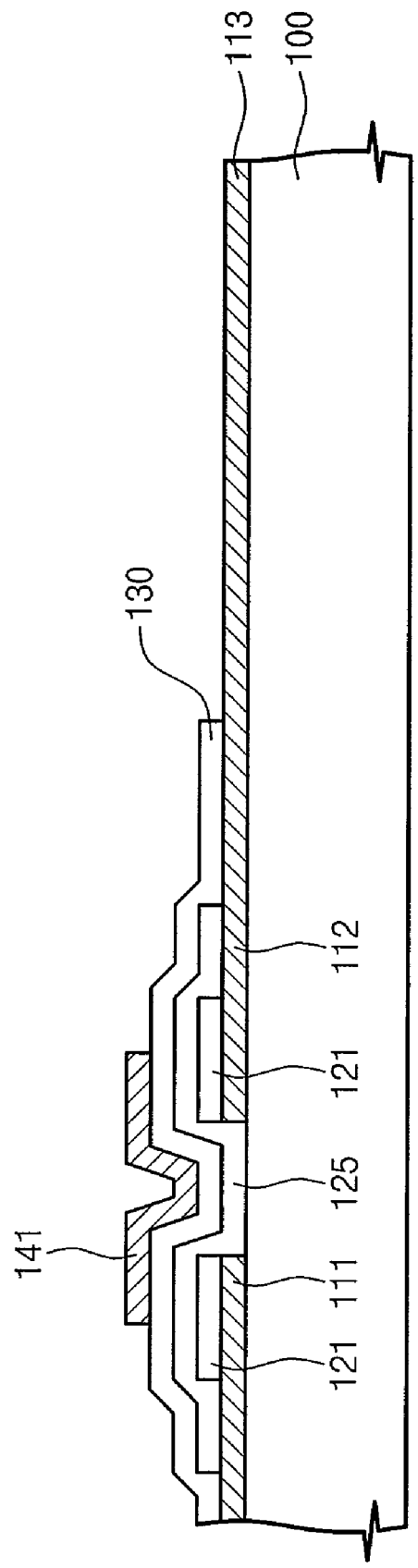
FIG. 2A is a sectional view taken along line I-I' shown in FIG. 1.

FIG. 2A is a sectional view taken along line I-I' shown in FIG. 1.

Referring to FIG. 2A, the source electrode 111, the drain electrode 112, and the pixel electrode 113 are formed on the same layer of the substrate 100. The drain electrode 112 is directly connected with the pixel electrode 113. The source electrode 111, the drain electrode 112, and the pixel electrode 113 include the same material. The material includes opaque metal such as aluminum (Al), aluminum alloy, molybdenum (Mo), and chromium (Cr). In addition, the material includes indium zinc oxide (IZO) or indium tin oxide (ITO) being transparent. The above structure, in which the drain electrode 112 is directly connected to the pixel electrode 113, has advantages in the manufacturing process, and the advantages will be described later.

An ohmic contact layer pattern 121 is formed on the source electrode 111 and the drain electrode 112 while being divided along the source electrode 111 and the drain electrode 112 which are spaced apart from each other. The semiconductor layer pattern 125 is formed on the ohmic contact layer pattern 121 while partially covering the source electrodes 111 and the drain electrode 112. The ohmic contact layer pattern 121 and the semiconductor layer pattern 125 include semiconductor material such as silicon (Si).

The semiconductor material includes amorphous silicon or poly-silicon. The ohmic contact layer pattern 121 further includes impurity ions, thereby improving electrical contact characteristics of the source electrode 111 and the drain electrode 112. The semiconductor layer pattern 125 covers the space between the source electrode 111 and the drain electrode 112 corresponding to a channel area.

A first insulating layer pattern 130 is formed on the semiconductor layer pattern 125 except where it is opened in the area of the pixel electrode 113. Insulation pattern 130 includes silicon oxide or silicon nitride. The gate electrode 141 is formed on the first insulting layer pattern 130. The gate electrode 141 covers the channel area while partially overlapping with the source electrode and the drain electrode, when viewed in the plan view. The gate electrode 141 includes opaque metal such as aluminum (Al), aluminum alloy, molybdenum (Mo), and chromium (Cr).

Referring to FIGS. 1 and 2A, a gate signal is applied to the gate line 140 during the operation of a display apparatus, thereby turning on the thin film transistor T. A data signal corresponding to image information is applied to the data line 110. Data voltage is applied to the pixel electrode 113 by the data signal. An electric field is formed over the pixel electrode 113 by the data voltage. Various kinds of display units may be provided in the upper portion of the pixel electrode 113. The type of the display units varies depending on the type of display apparatuses employing the substrate 100. For example, the display unit may be liquid crystal. The alignment direction of the liquid crystal is changed according to the intensity of the electric field applied thereto, and a corresponding image is displayed while light transmittance will vary depending on the alignment direction of the liquid crystal.

Light is irradiated onto the thin film transistor T during the above operation, so that leakage current may flow through the channel. Accordingly, the data voltage applied to the pixel electrode 113 may be distorted due to the erroneous operation caused by the leakage current. According to the present embodiment, since the gate electrode 141 includes opaque metal on the upper side of the channel area, the gate electrode 141 blocks light from being irradiated onto the channel area, thereby preventing leakage current.

FIG. 2B is a sectional view taken along line I-I' shown in FIG. 1 according to another embodiment of the present invention. According to the present invention, the same reference numerals will be assigned to the elements identical to those of the previous embodiment and detailed description thereof will be omitted in order to avoid redundancy.

Referring to FIG. 2B, a second insulating layer pattern 150 is formed on the gate electrode 141. The second insulating layer pattern 150 covers the gate electrode 141. A gate signal is applied to the gate electrode 141 during the operation of the display apparatus. However, since the gate signal will be of a high voltage, an undesirable electric field may be formed at the gate electrode 141 to which the high voltage is applied. The undesirable electric field exerts an influence on the display unit on the pixel electrode 113, causing erroneous operation. However, the second insulating layer pattern 150 covers the gate electrode 141 with a sufficient thickness, thereby preventing the influence of the undesirable electric field.

Similar to the gate electrode 141, while the data signal and the gate signal are being applied to the data line 110 and the gate line 140, respectively, an undesirable electric field may be provided from the data line 110 or the gate line 140, causing erroneous operation. To prevent the erroneous operation, the second insulating layer pattern 150 may cover the data line 110 or the gate line 140 in addition to the gate electrode 141.

The second insulating layer pattern 150 has the same material as that of the first insulating layer pattern 130. The first and second insulating layer patterns 130 and 150 are opened in the area of the pixel electrode 113. An electric field, which is formed above the pixel electrode 113, is employed to display an image as described above. In order to directly apply the electric field to the display unit, the first and second insulating layers 130 and 150 are opened to expose the pixel electrode 113.

Hereinafter, details will be described with respect to a method of fabricating the display substrate viewed in the vertical structure of FIGS. 2A and 2B.

Figure 3C:
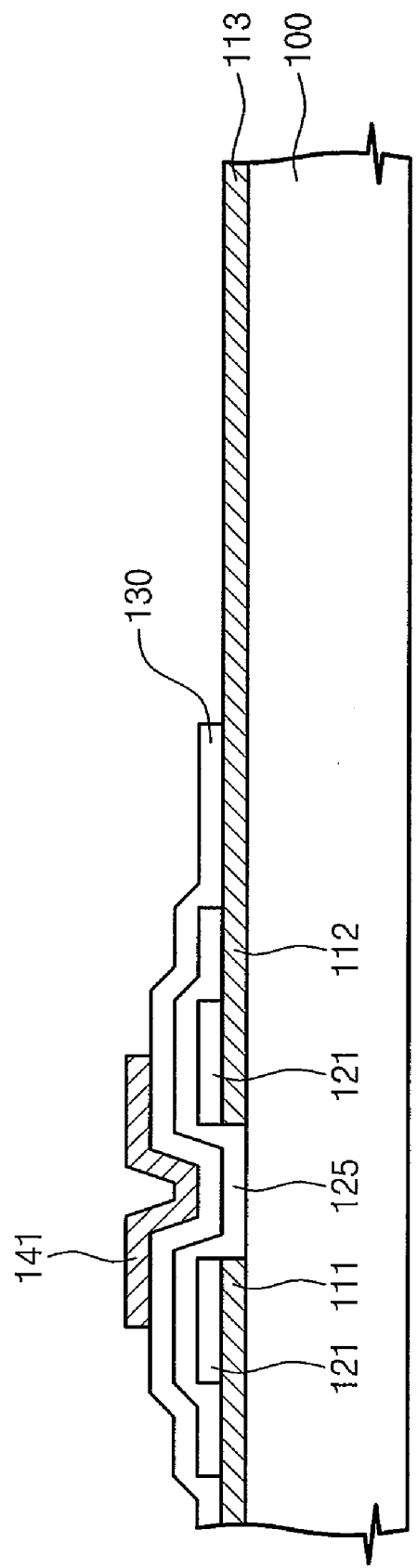

FIGS. 3A to 3C are sectional views showing the method of fabricating the display substrate shown in FIG. 2A.

Referring to FIG. 3A, a data conductive layer is formed on the substrate 100. The substrate 100 is a transparent insulating substrate including glass or plastic. The data conductive layer may be formed through sputtering deposition. The data conductive layer is patterned, thereby forming the source electrode 111, the drain electrode 112, and the pixel electrode 113. Although it is not shown in FIG. 3A, the data line 110 is formed together with the source electrode 111. The patterning process is performed by forming an etching mask on the data conductive layer and then etching the data conductive layer along the etching mask. In order to form the etching mask, a photoresist film is coated on the data conductive layer, and an exposure and development process is performed with respect to the photoresist film. The first photo mask is used in the exposure process.

In the above process, one photo mask is used, and the photo process including the exposure and development process is performed one time. This is because the pixel electrode 113 is directly connected to the drain electrode 112 on the same layer of the substrate 100. If the pixel electrode 113 is additionally formed, an additional photo mask and an additional photo process are required. However, since the pixel electrode 113 is formed together with the drain electrode 112 without the additional process according to the present embodiment, the number of process steps and photo masks is reduced, the productivity is improved, and the manufacturing costs are reduced.

Referring to FIG. 3B, an ohmic contact layer is formed on the source electrode 111 and the drain electrode 112. The ohmic contact layer is patterned, thereby forming the ohmic contact layer pattern 121. A semiconductor layer is formed on the ohmic contact layer pattern 121. The semiconductor layer is patterned, thereby forming the semiconductor layer pattern 125. A first insulating layer is formed on the semiconductor layer pattern 125 and patterned, thereby forming the first insulating layer pattern 130.

The ohmic contact layer, the semiconductor layer, and the first insulating layer may be formed through a plasma chemical vapor deposition method. The ohmic contact layer, the semiconductor layer, and the first insulating layer are patterned similar to the data conductive layer. When the ohmic contact layer, the semiconductor layer, and the first insulating layer are patterned, photo masks and photo processes are individually required for the layers. Accordingly, in the present process step, three photo masks and three photo processes are required.

Referring to FIG. 3C, a gate conductive layer is formed on the first insulating layer pattern 130. The gate conductive layer may be formed through a sputtering deposition method. The gate conductive layer is patterned, thereby forming the gate electrode 141. Although it is not shown in FIG. 3C, the gate line 140 is formed together with the gate electrode 141. One photo mask is required, and the photo process is performed one time in the above patterning process.

As described above, according to the present embodiment, five photo masks and five photo processes are required. This is because one photo mask and one photo process for the pixel electrode 113 are reduced.

FIGS. 4A to 4F are sectional views showing the method of fabricating the display substrate shown in FIG. 2B. According to the present embodiment, the same reference numerals will be assigned to the elements identical to those of the previous embodiment, and detailed description thereof will be omitted in order to avoid redundancy.

Figure 4A:
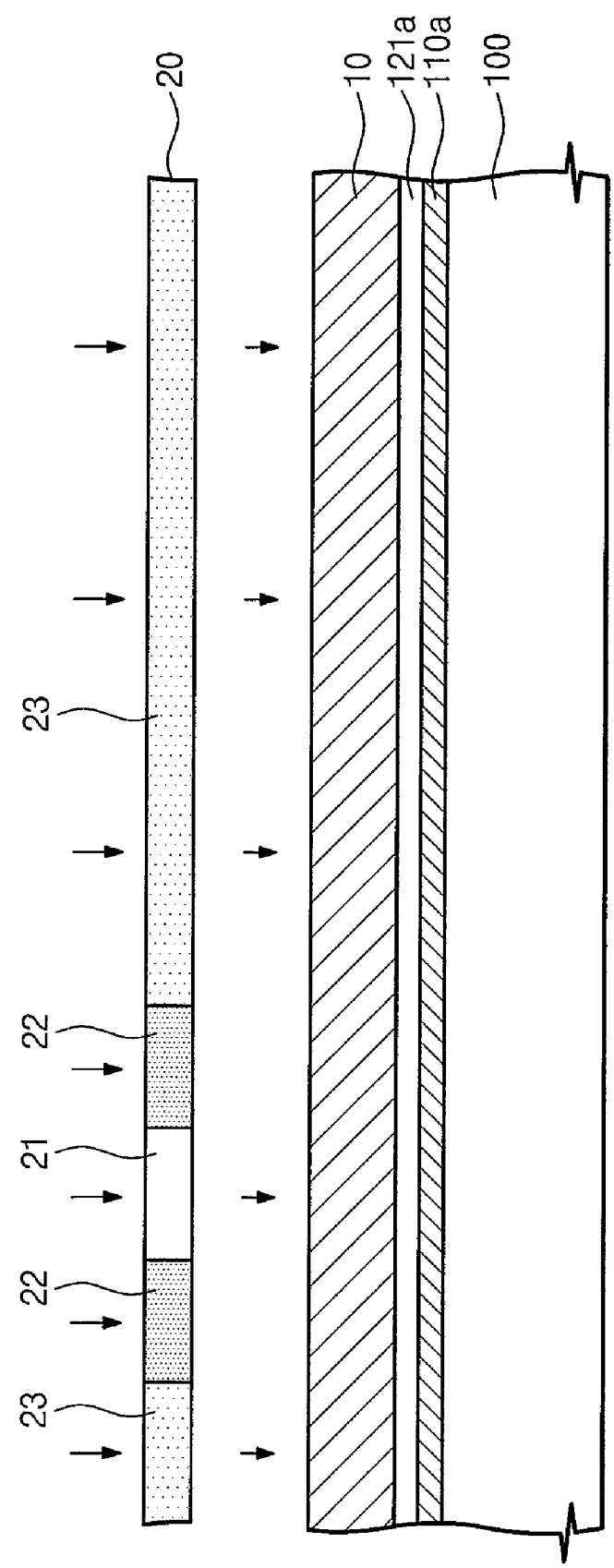

Referring to FIG. 4A, a data conductive layer 110a and an ohmic contact layer 121a are formed on the substrate 100. A photoresist film 10 is coated on the ohmic contact layer 121a, and an exposure process is performed with respect to the photoresist film 10. The photo mask used in the exposure process includes a transmitting part 21, a non-transmitting part 22, and an intermediate transmitting part 23. The transmitting part 21 transmits light, the non-transmitting part 22 blocks light, and the intermediate transmitting part 23 transmits only a portion of light. The photo mask having the intermediate transmitting part 23 includes a slit mask and a halftone mask.

The slit mask has the intermediate transmitting part 23 formed with a plurality of slits, and the intervals between the slits are regulated, so that the amount of transmitted light can be adjusted. The halftone mask has the intermediate transmitting part 23 including material used to transmit only a portion of light, and the amount of transmitted light is adjusted in accordance with the component of the material.

Figure 4B:
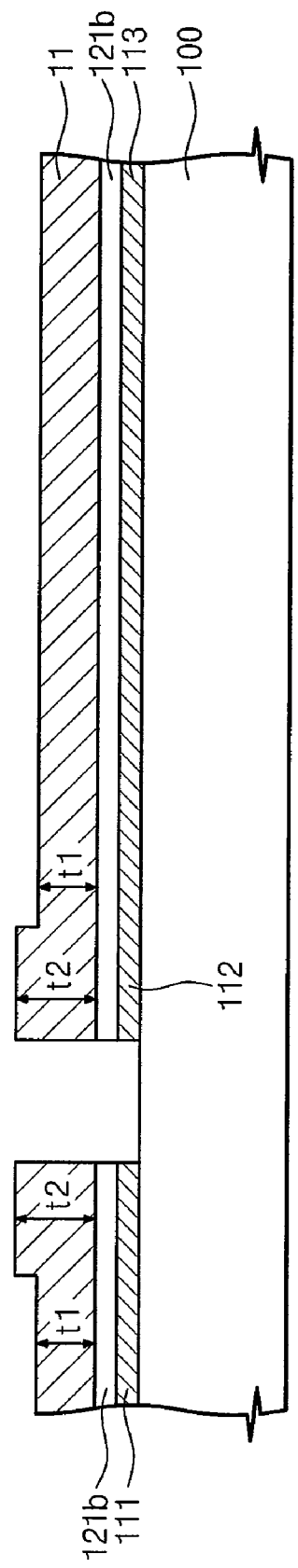

Referring to FIG. 4B, the exposed photoresist film 10 is subject to a development process, thereby forming the first photoresist pattern 11. The photoresist film 10 may have a positive type or a negative type. On the assumption that the photoresist film 10 has the positive type, the photoresist film 10 corresponding to the transmitting part 21 is entirely removed. In addition, the photoresist film 10 corresponding to the intermediate transmitting part 23 is partially removed by a predetermined thickness. The photoresist film 10 corresponding to the non-transmitting part 22 may remain without being removed. Accordingly, the first photoresist pattern 11 corresponding to the intermediate transmitting part 23 has the first thickness t1, and the first photoresist pattern 11 corresponding to the non-transmitting part 22 has the second thickness t2 thicker than the first thickness t1. In addition, the first photoresist pattern 11 corresponding to the transmitting part 21 is opened.

The ohmic contact layer 121a and the data conductive layer 110a are etched by using the first photoresist pattern 11 as an etching mask. An intermediate ohmic contact layer pattern 121b is formed by etching the ohmic contact layer 121a. In addition, the source electrode 111, the drain electrode 112, and the pixel electrode 113 are simultaneously formed by etching the data conductive layer 110a.

Figure 4C:
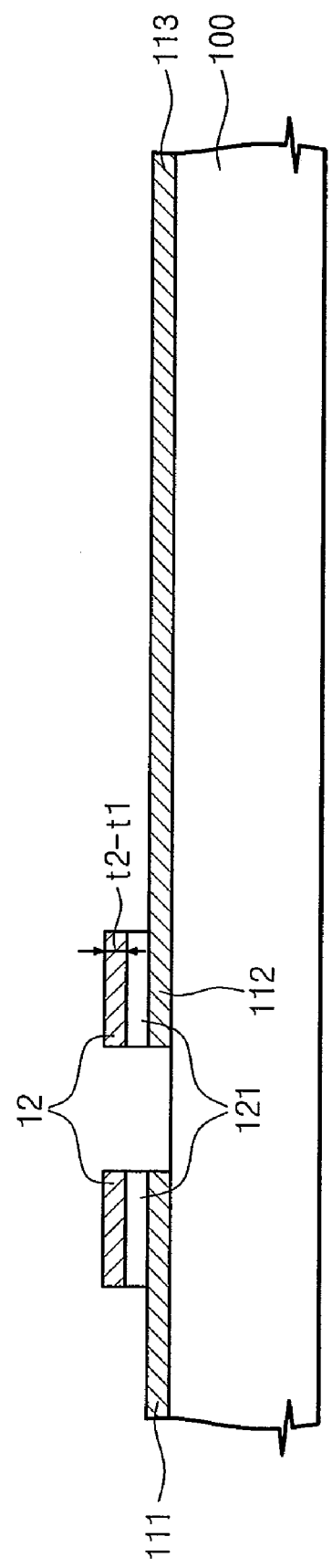

Referring to FIG. 4C, an etching process is performed with respect to the entire surface of the first photoresist pattern 11, thereby removing the first photoresist pattern 11 by the first thickness t1. Through the etching process, the intermediate ohmic contact layer pattern 121b is partially exposed, and a second photoresist pattern 12 having a thickness t2−t1 corresponding to the difference between the first and second thicknesses is formed. The intermediate ohmic contact layer pattern 121b is etched by using the second photoresist pattern 12 as an etching mask, thereby forming the ohmic contact layer pattern 121.

In the above process, one photo mask is required, and the photo process is performed one time in order to form the source electrode 111, the drain electrode 112, the pixel electrode 113, and the ohmic contact layer pattern 121. In other words, the number of the photo masks and the photo processes can be reduced as compared with those of the previous embodiment.

Figure 4D:
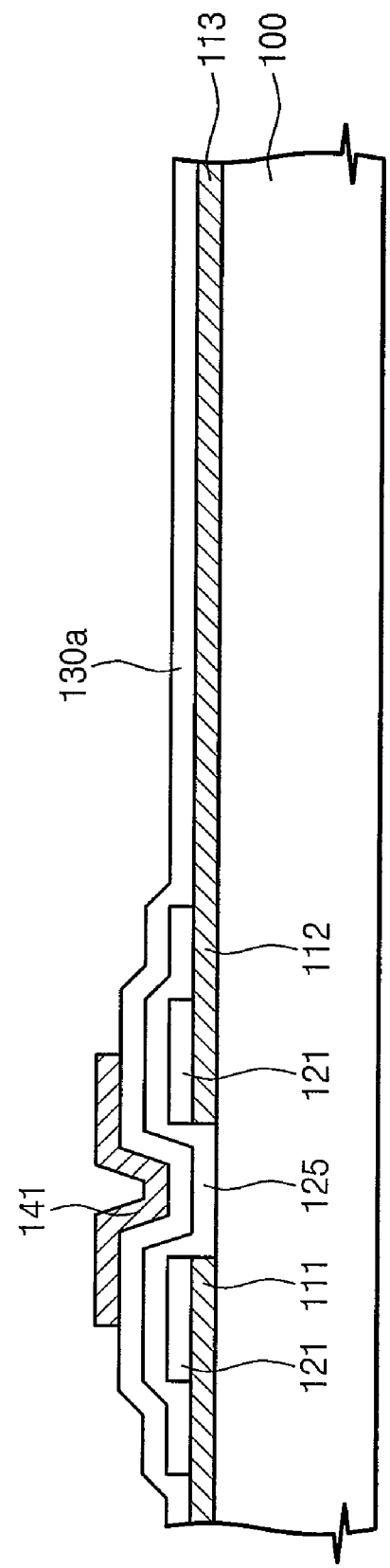

Referring to FIG. 4D, the semiconductor layer pattern 125 is formed on the ohmic contact layer pattern 121. Then, the first insulating layer 130a is formed on the entire surface of the substrate 100 to cover the semiconductor layer pattern 125. The gate electrode 141 is formed on the first insulting layer 130a. When the semiconductor layer pattern 125 and the gate electrode 141 are formed, only one photo mask and one photo process are required, respectively.

Referring to FIG. 4E, the second insulating layer 150a is formed on the entire surface of the substrate 100 to cover the gate electrode 141. After coating a photoresist film on the second insulating layer 150a, a photo process is performed with respect to the photoresist film, thereby forming the photoresist pattern 20. When forming the photoresist pattern 20, an additional photo mask is required.

Referring to FIG. 4F, the first and second insulating layers 130a and 150a are etched by using the photoresist pattern 20 as an etching mask. In the above process, the first and second insulating layer patterns 130 and 150 are formed. In this case, one photo mask is performed, and the photo process is performed one time in order to form the first and second insulating layer patterns 130 and 150.

Accordingly, four photo masks and four photo processes are required in the present embodiment.

Figure 6:
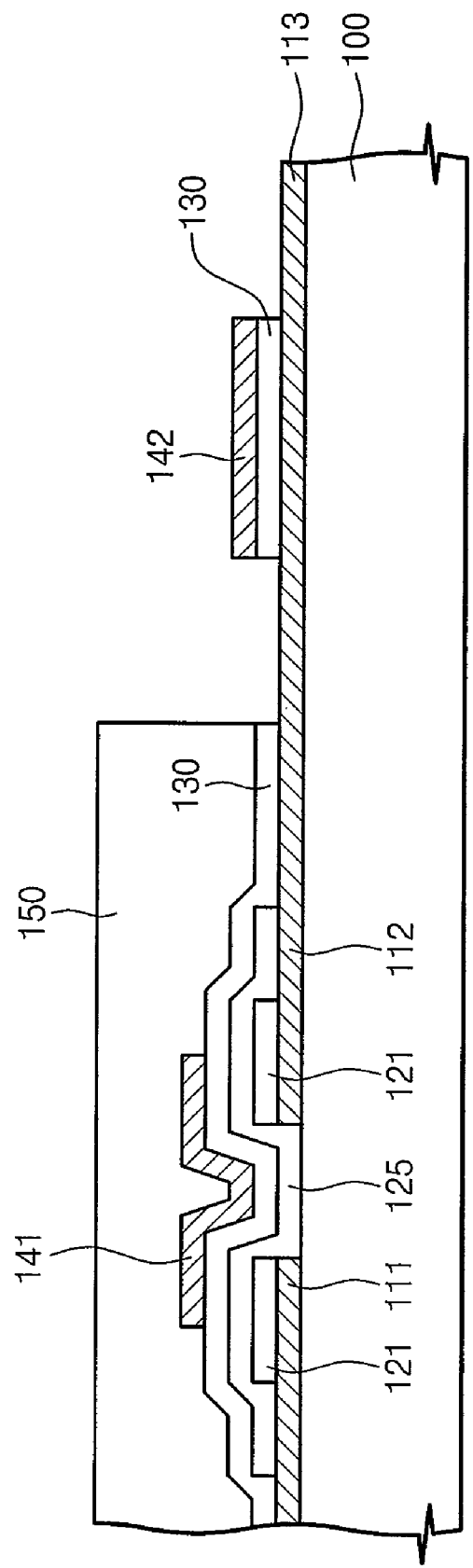
FIG. 6 is a sectional view taken along line II-II' shown in FIG. 5.

FIG. 5 is a plan view showing the display substrate according to another embodiment of the present invention, and FIG. 6 is a sectional view taken along line II-II' shown in FIG. 5. According to the present embodiment, the same reference numerals will be assigned to the elements identical to those of the previous embodiment, and detailed description thereof will be omitted in order to avoid redundancy.

Referring to FIG. 5, a plurality of pixel areas are defined on the substrate 100. Each of pixel areas PA includes thin film transistor T, pixel electrode 113, and storage electrode 142. The thin film transistor T includes a source electrode 111, a drain electrode 112, a semiconductor layer pattern 125, and a gate electrode 141. The pixel electrode 113 expands into the pixel area PA from the end portion of the drain electrode 112. The storage electrode 142 is positioned at the center portion of the pixel area PA while overlapping with the pixel electrode 113, when viewed in a plan view.

Referring to FIG. 6, a first insulating layer pattern 130 is interposed between the pixel electrode 113 and the storage electrode 142. Accordingly, a storage capacitor having two electrodes facing each other and a dielectric substance interposed between the two electrodes can be formed. The two electrodes correspond to the pixel electrode 113 and the storage electrode 142. The dielectric substance corresponds the first insulating layer pattern 130.

The storage capacitor is used as an auxiliary element during the operation of the display apparatus to sustain the data voltage applied to the pixel electrode 113 for a predetermined time interval. In some case, different voltage needs to be applied according to the position of the pixel area during the operation of the display apparatus. In this case, voltage different from the data voltage, which is applied to the pixel electrode 113, may be applied by using the storage electrode 142.

According to the previous embodiment, the storage electrode 142 may be omitted. If the storage electrode 142 is used, the storage electrode 142 may be variously formed in various positions. In other words, differently from the storage electrode shown in FIG. 5, the area, in which the storage electrode 142 overlaps with the pixel electrode 113, may be formed more widely or narrowly. The storage electrode 142 may include sub-electrodes, which are spaced apart from each other by a predetermined interval in a row or column direction, instead of being integrally formed.

FIGS. 7A to 7C are sectional views showing the method of fabricating the display substrate shown in FIG. 6. In the present embodiment, the same reference numerals will be assigned to elements identical to those of the previous embodiment, and detailed description thereof will be omitted in order to avoid redundancy.

Referring to FIG. 7A, the source electrode 111, the drain electrode 112, and the pixel electrode 113 are formed on the substrate 100. An ohmic contact layer pattern 121 is formed on the source electrode 111 and the drain electrode 112. The source electrode 111, the drain electrode 112, the pixel electrode 113, and the ohmic contact layer pattern 121 may be formed through two photo processes using two photo masks, or through one photo process using one photo mask.

A semiconductor layer pattern 125 is formed on the ohmic contact layer pattern 121. A first insulating layer 130a is formed on the semiconductor layer pattern 125. A gate conductive layer is formed on the first insulating layer 130a. Then, the gate conductive layer is patterned, thereby forming the gate electrode 141 and the storage electrode 142.

Referring to FIG. 7B, a second insulating layer is formed on the gate electrode 141 and the storage electrode 142. The second insulating layer is formed by coating a transparent organic photoresist layer. An exposure and development process is performed with respect to the second insulating layer. The second insulating layer pattern 150 is formed through the development process. The storage electrode 142 and the first insulating layer 130a are exposed by the second insulating layer pattern 150.

Referring to FIG. 7C, the first insulating layer 130a is etched by using the second insulating layer pattern 150 as an etching mask. The etching process is performed through a dry etching method using plasma. The exposed portion of the first insulating layer 130a is removed through the etching process. The storage electrode 142 and the first insulating layer 130a have etching selectivity with respect to each other, and the storage electrode 142 is preserved while etching the first insulating layer 130a. Accordingly, the first insulating layer pattern 130 is formed to cover the pixel electrode 113 in the area of the storage electrode 142, and be opened in the remaining area of the pixel electrode 113.

Hereinafter, details will be described regarding the display apparatus employing the substrate 100 having the above structure and fabricated through the above processes.

Figure 8:
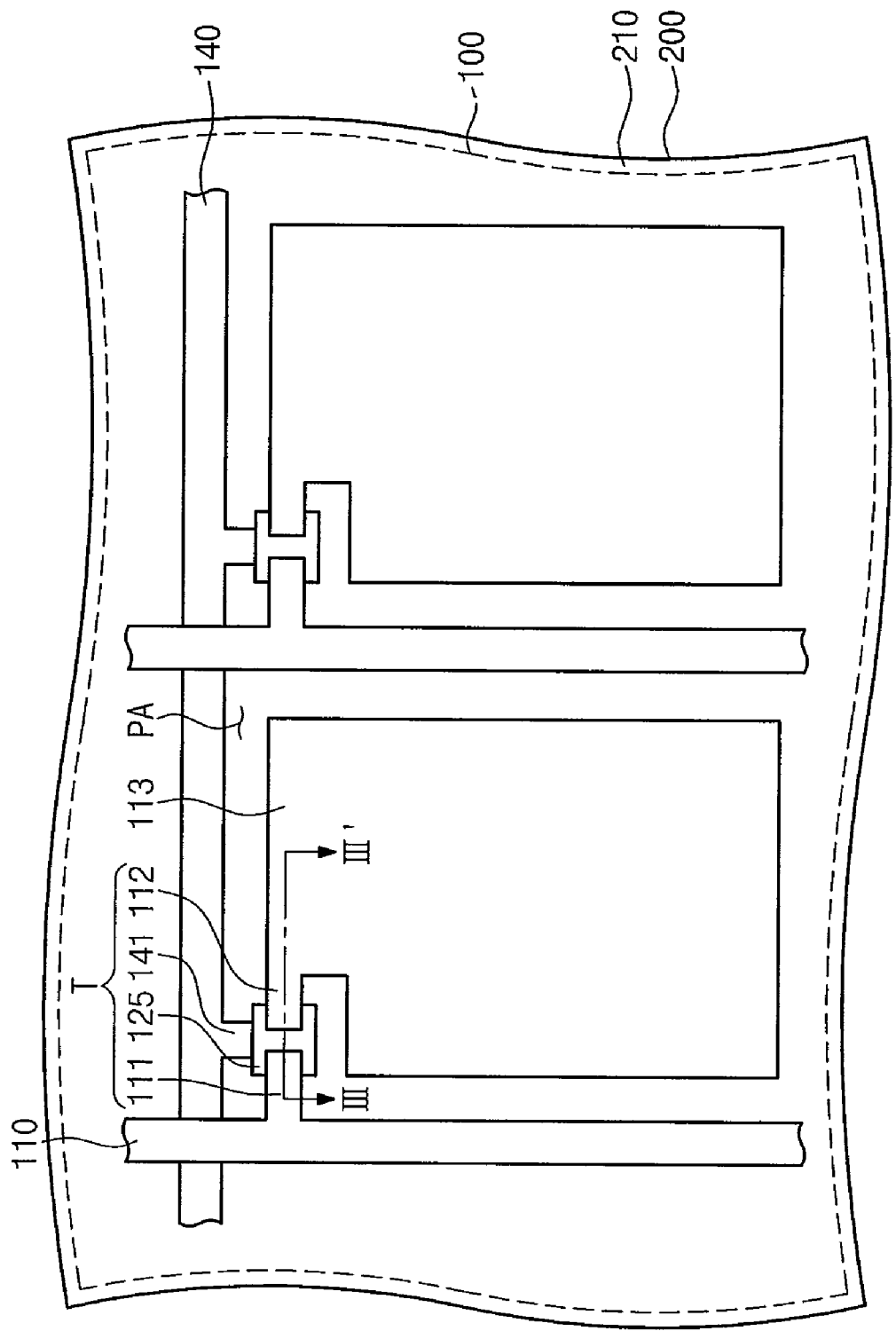
FIG. 8 is a plan view showing a display apparatus according to an exemplary embodiment of the present invention.

FIG. 8 is a plan view showing the display apparatus according to an exemplary embodiment of the present invention.

Referring to FIG. 8, first and second substrates 100 and 200 are provided while facing each other. The first substrate 100 includes the display substrates described above according to the embodiments. The same reference numerals will be assigned to elements identical to those of the display substrates, and detailed description thereof will be omitted in order to avoid redundancy.

A plurality of pixel areas are defined on the first substrate 100. Each of the pixel areas PA includes thin film transistors T and the pixel electrodes 113. The thin film transistor T includes the source electrode 111, the drain electrode 112, the semiconductor layer pattern 125, and the gate electrode 141. The pixel electrode 113 expands into the pixel area PA from the end portion of the drain electrode 112. A common electrode 210 is formed on the second substrate 200 while facing the pixel electrode 113. Although the pixel electrode 113 is separately formed according to the pixel area PA, the common electrode 210 is integrally formed regardless of the pixel area PA. The common electrode 210 includes conductive material being transparent.

Figure 9A:
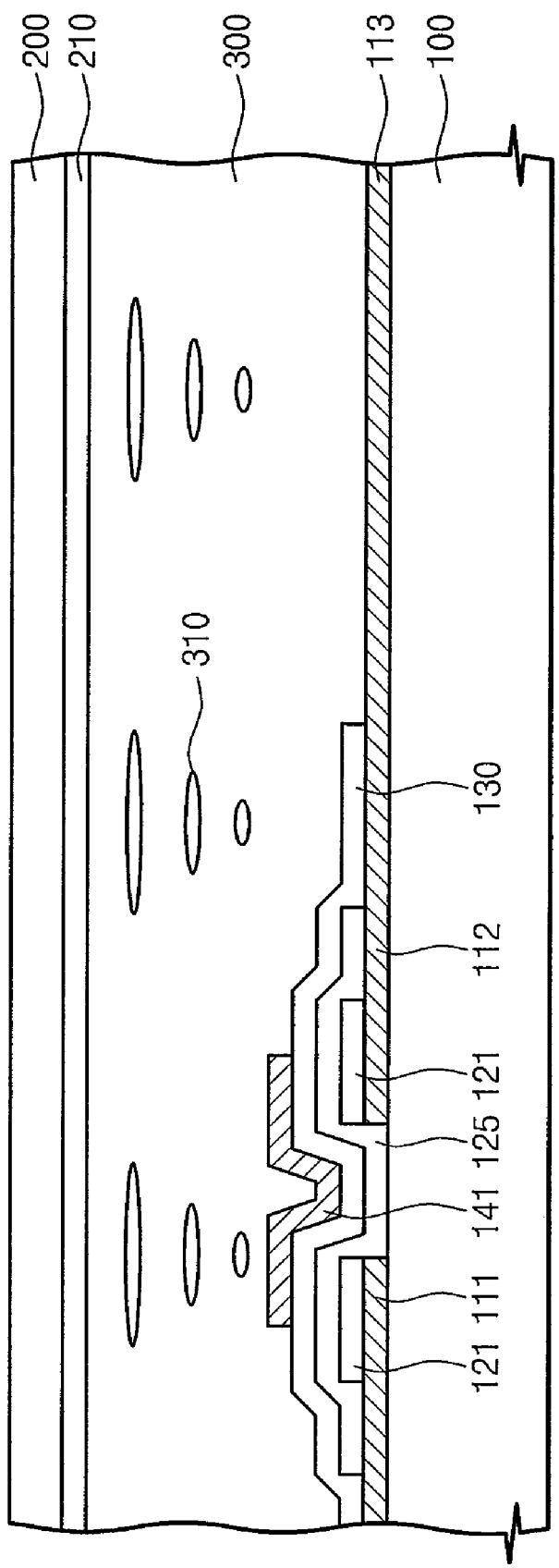
FIG. 9A is a sectional view taken along line III-III' shown in FIG. 8.

FIG. 9A is a sectional view taken along line III-III' shown in FIG. 8.

Referring to FIG. 9A, the liquid crystal 310 is aligned between the first and second substrates 100 and 200. Data voltage and common voltage are applied to the pixel electrode 113 and the common electrode 210, respectively, and an electric field is applied to the liquid crystal layer 300 due to the potential difference between the data voltage and the common voltage. The alignment direction of the liquid crystal 310 is changed according to the electric field, and the reflective index of light passing through the liquid crystal layer 300 is changed according to the alignment direction of the liquid crystal 310. Accordingly, the electric field is controlled to adjust the reflective index of the light, thereby displaying a corresponding image.

Since the liquid crystal 310 is non-emissive, the liquid crystal 310 may receive the light from an additional light emitting unit or the exterior. If the light is provided from the additional light emitting unit, the light is incident to the lower portion of the first substrate 100 and then passes to the upper portion of the second substrate 200. Preferably, the source electrode 111, the drain electrode 112, and the pixel electrode 113 include indium zinc oxide (IZO) or indium tin oxide (ITO) being transparent such that the light can be transmitted.

If the light is incident from the exterior, the incident light is reflected from the pixel electrode 113 to the exterior through the liquid crystal layer 300. Preferably, the source electrode 111, the drain electrode 112, and the pixel electrode 113 include metal such as aluminum (Al) having a high reflective index such that light is reflected.

Figure 9B:
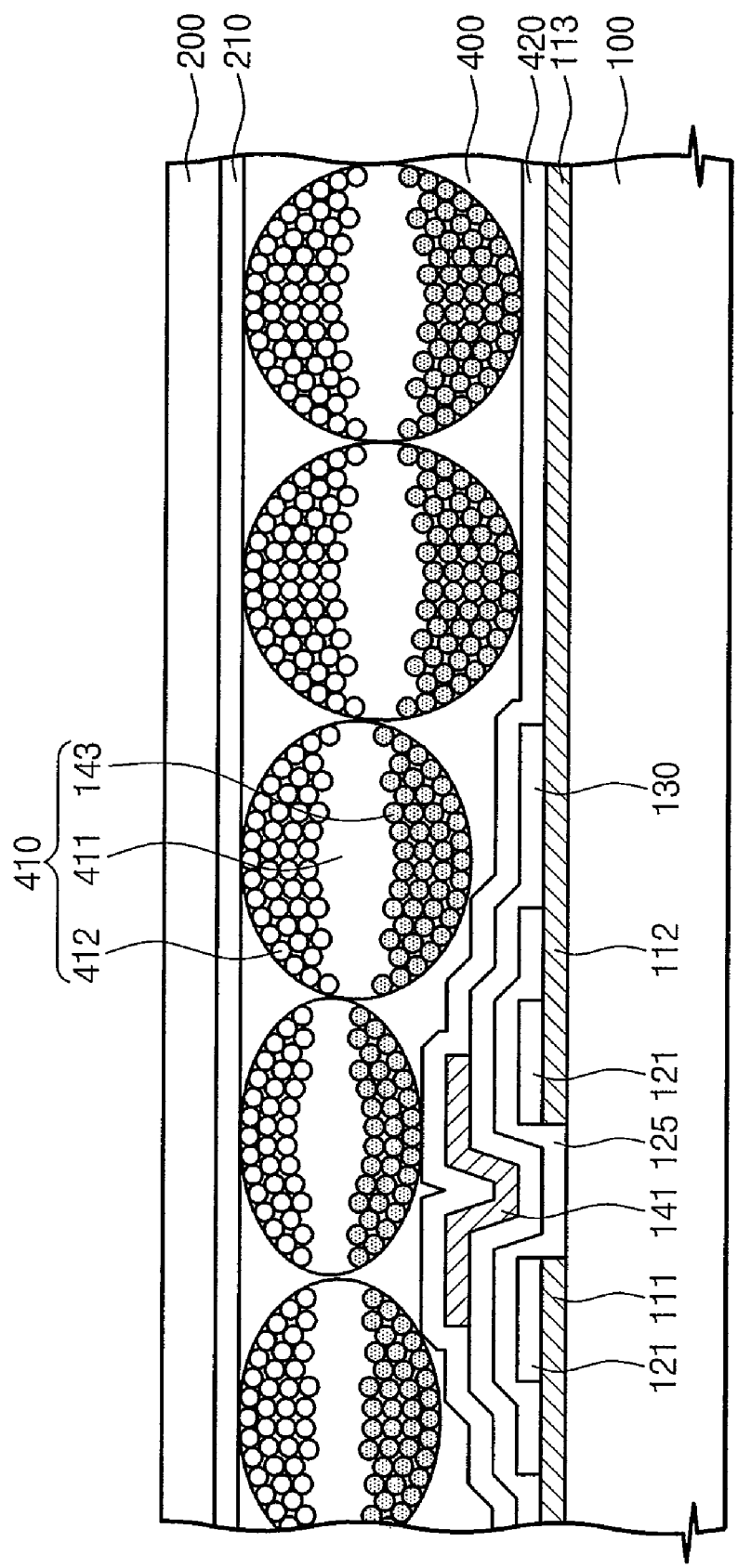
FIG. 9B is a sectional view taken along taken along line III-III' shown in FIG. 8 according to another embodiment of the present invention.

FIG. 9B is a sectional view taken along taken along line III-III' shown in FIG. 8 according to another embodiment of the present invention. The present embodiment employs the structure and the operational procedure of the first and second substrates 100 and 200 of the display apparatus, which are the same as those of previous embodiments.

Referring to FIG. 9B, a color layer 400 is interposed between the first and second substrates 100 and 200. The color layer 400 includes a plurality of microcapsules 410 having a sphere shape. Each microcapsule 410 has a size similar to the diameter of a human hair. The microcapsule 410 includes a dispersion medium 411 having transparent insulating liquid and a plurality of first and second pigment particles 412 and 413 dispersed in the dispersion medium 411. The first and second pigment particles 412 and 413 are charged with different polarities, and have different colors. In other words, the first pigment particle 412 has a polarity and a color different from those of the second pigment particle 413.

For example, the first pigment particle 412 is charged with a positive polarity, and includes material such as titanium dioxide ($TiO_2$) to have a white color. The second pigment particle 413 is charged with a negative polarity, and includes carbon powder such as carbon black to have a black color. The first and second pigment particles 412 and 413 have different positions according to an electric field formed between the first and second substrates 100 and 300.

In other words, if an electric field is formed toward the common electrode 210 from the pixel electrode 113, the second pigment particle 413 moves toward the first substrate 100, and the first pigment particle 412 moves toward the second substrate 200, thereby displaying a white color. In contrast, if the electric field is formed toward the pixel electrode 113 from the common electrode 210, the first pigment particle 412 moves toward the first substrate 100, and the second pigment particle 413 moves toward the second substrate 200, thereby displaying a black color. Such color display is independently achieved according to the pixel areas.

An adhesive member 420 is formed between the color layer 400 and the first substrate 100. The color layer 400 is adhered to the first substrate 100 by the adhesive member 420. The color layer 400 is integrally formed with the second display substrate 200, so that the color layer 400 and the second display substrate 200 may be fabricated as one film. Adhesive member 420 is interposed between the color layer 400 and the second substrate 200 to adhere the color layer 400 to the second substrate 200.

FIG. 9C is a sectional view taken along line III-III' shown in FIG. 8 according to another embodiment of the present invention. The present embodiment employs the structure and the operational procedure of the first and second substrates 100 and 200, which are the same as those of previous embodiment.

Referring to FIG. 9C, a color layer 500 is interposed between the first and second substrates 100 and 200. The color layer 500 represents a predetermined color according to an electric field formed between the first and second substrates 100 and 200. For example, the color layer 500 includes a fluid layer 510 consisting of insulating liquid having a predetermined color and a plurality of pigment particles 520 dispersed in the fluid layer 510. Each pigment particle 520 and the fluid layer 510 have different colors, and each pigment particle 520 is charged with a predetermined polarity.

If the pigment particle 520 has a negative polarity, and an electric field is formed toward the common electrode 210 from the pixel electrode 113, the pigment particle 520 moves toward the first substrate 100 to display the color of the fluid layer 510. In contrast, if an electric field is formed toward the pixel electrode 113 from the common electrode 210, the pigment particle 520 moves toward the second substrate 200, thereby displaying the color of the pigment particle 520.

The color displayed is different in each pixel area PA. To this end, a partition 530 is provided such that the pigment particles 520 belonging to different pixel areas are not mixed with each other. In other words, the color layer 500 of each pixel area PA is separated by the partition 530.

As described above, according to the embodiments, the gate electrode is higher than both the source electrode and the drain electrode, so that the incidence of external light into a channel area is prevented. In addition, the drain electrode and the pixel electrode are simultaneously formed through the same process, so that the number of the process steps and the photo masks is reduced, the productivity is improved, and the manufacturing costs are reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. A display apparatus comprising:
a first substrate comprising a pixel area defined thereon;
a second substrate facing the first substrate;
a data line and a gate line crossing each other while being insulated from each other on the first substrate, and corresponding to the pixel area;
a source electrode branching from the data line;
a drain electrode spaced apart from the source electrode;

a pixel electrode expanding into the pixel area from an end portion of the drain electrode;

a semiconductor layer pattern disposed the source electrode and the drain electrode;

a first insulating layer pattern covering the semiconductor layer pattern except for the area in which the pixel electrode is formed;

a gate electrode branching from the gate line on the first insulating layer pattern while partially overlapping the source electrode and the drain electrode, when viewed in a plan view;

a common electrode formed on the second substrate, a color layer interposed between first and second substrates and having polarity particles; and an adhesive member interposed between the color layer and the first substrate, the adhesive member directly contacting at least a part of the first insulating layer pattern.

2. The display apparatus of claim 1, further comprising an ohmic contact layer pattern disposed between the source and drain electrodes and the semiconductor layer pattern, and divided along the source and drain electrodes which are spaced apart from each other.

3. The display apparatus of claim 1, further comprising a storage electrode spaced apart from the gate electrode while partially overlapping the pixel electrode, when viewed in a plan view.

4. The display apparatus of claim 3, wherein the first insulating layer pattern covers the pixel electrode in an area in which the storage electrode overlaps the pixel electrode.

5. The display apparatus of claim 1, wherein the common electrode is transparent.

6. The display apparatus of claim 1, wherein the color layer comprises a plurality of microcapsules formed by encapsulating the polarity particles.

* * * * *